United States Patent
Stribley

(10) Patent No.: US 9,559,170 B2
(45) Date of Patent: Jan. 31, 2017

(54) ELECTROSTATIC DISCHARGE PROTECTION DEVICES

(75) Inventor: Paul Ronald Stribley, Devon (GB)

(73) Assignee: X-FAB SEMICONDUCTOR FOUNDRIES AG, Erfurt (DE)

(*) Notice: Subject to any disclaimer, the term of this patent is extended or adjusted under 35 U.S.C. 154(b) by 0 days.

(21) Appl. No.: 13/410,016

(22) Filed: Mar. 1, 2012

(65) Prior Publication Data
US 2013/0228868 A1    Sep. 5, 2013

(51) Int. Cl.
| | | |
|---|---|---|
| H01L 29/10 | (2006.01) | |
| H01L 27/02 | (2006.01) | |
| H01L 29/78 | (2006.01) | |
| H01L 29/861 | (2006.01) | |
| H01L 29/06 | (2006.01) | |
| H01L 29/423 | (2006.01) | |

(52) U.S. Cl.
CPC ......... *H01L 29/1083* (2013.01); *H01L 27/027* (2013.01); *H01L 29/0626* (2013.01); *H01L 29/7835* (2013.01); *H01L 29/8611* (2013.01); *H01L 29/0692* (2013.01); *H01L 29/1045* (2013.01); *H01L 29/1087* (2013.01); *H01L 29/4238* (2013.01); *H01L 2924/0002* (2013.01)

(58) Field of Classification Search
USPC .................. 257/343, 139–145, 360, E29.027
See application file for complete search history.

(56) References Cited

U.S. PATENT DOCUMENTS

| 5,682,054 | A | * | 10/1997 | Nakashima ............. G06F 7/501 257/355 |
|---|---|---|---|---|
| 6,653,709 | B2 | * | 11/2003 | Wu .................... H01L 21/82381 257/355 |
| 6,844,593 | B2 | * | 1/2005 | Kikuchi .............. H01L 29/1083 257/339 |
| 7,098,513 | B2 | * | 8/2006 | Chatty et al. ................. 257/382 |
| 7,135,743 | B2 | * | 11/2006 | Manna et al. ................. 257/357 |
| 7,482,218 | B1 | * | 1/2009 | McCollum .......... H01L 27/0266 257/E21.042 |
| 7,910,951 | B2 | * | 3/2011 | Vashchenko .................. 257/175 |
| 8,492,834 | B2 | * | 7/2013 | Lai et al. ....................... 257/337 |
| 2004/0164354 | A1 | * | 8/2004 | Mergens et al. .............. 257/355 |
| 2007/0170469 | A1 | * | 7/2007 | Wu et al. ....................... 257/213 |
| 2010/0301388 | A1 | * | 12/2010 | Lin et al. ....................... 257/141 |
| 2011/0101454 | A1 | * | 5/2011 | Ichijo et al. .................. 257/339 |
| 2011/0169078 | A1 | * | 7/2011 | Yang et al. ................... 257/336 |
| 2011/0175199 | A1 | * | 7/2011 | Lin et al. ....................... 257/605 |
| 2012/0161235 | A1 | * | 6/2012 | Huang et al. ................. 257/355 |
| 2013/0182357 | A1 | * | 7/2013 | Brodsky .......................... 361/56 |

(Continued)

OTHER PUBLICATIONS

*Electrostatic Discharge (ESD) Protection Test Handbook, Second Edition*, published by KeyTek Instrument Corp., 1986, pp. 1-21.

(Continued)

*Primary Examiner* — Ali Naraghi
(74) *Attorney, Agent, or Firm* — Thompson Hine LLP

(57) ABSTRACT

A semiconductor device for electrostatic discharge (ESD) protection including a source, a gate, a drain having a drain diffusion, and a diffusion region extending from, or located under, the drain diffusion. The source, the gate, the drain and the diffusion region are located in or on a substrate. The diffusion region is laterally spaced from at least one of the gate or the outer edge of the drain diffusion.

29 Claims, 14 Drawing Sheets

(56) References Cited

U.S. PATENT DOCUMENTS

2013/0214821 A1* 8/2013 Chen .................. H03K 17/127
327/109

OTHER PUBLICATIONS

Amerasckera, A. et al., "The Impact of Technology Scaling on ESD Robustness and Protection Circuit Design," 1994, Proceedings of the EOS/ESD Symposium, pp. 6.1.1-6.1.4, 6.1.6-6.1.7, and 6.1.9.
Duvvury, D., "ESD Protection Issues for CMOS Technologies," Eurostat Conference Proceedings , 7 pages (1990).
MOSIS Technical Notes: "ESD Implant for TSMC Processes," http://www.mosis.com/pages/Faqs/tech-tsmc_esd , 4 pages (published at least as early as Feb. 28, 2012).
Wang, A.Z.H., *On-Chip ESD Protection for Integrated Circuits, An IC Design Perspective*, published by Kluwer Academic Publisher, Chapter 7, pp. 172, 174, 176, 178, 183, 186, 198, 199, 203, 206, 207, 210, and 217, (2002).
Mohan, N. et al., ESD Protection Design Methodology in Deep Sub-micron CMOS Technologies, University of Waterloo, Project Report, Course E&CE 730 (Topic 9), VLSI Quality, Reliability and Yield Engineering, 47 pages (2003).
Mergens, M.P.J. et al., "Multi-Finger Turn-On Circuits and Design Techniques for Enhanced ESD Performance and Width-Scaling," EOS/ESD Symposium, 11 pages (2001).
Duvvury, C. et al., "Output ESD Protection Techniques for Advanced CMOS Processes," Proceedings of the EOS/ESD Symposium, pp. 206-208, and 211 (1988).
Ker, M-D. et al., "ESD Implantations for On-Chip ESD Protection With Layout Consideration in 0.18-μm Salicided CMOS Technology," *IEEE Transactions on Semiconductor Manufacturing*, vol. 18, No. 2, pp. 328-337 (May 2005).

* cited by examiner

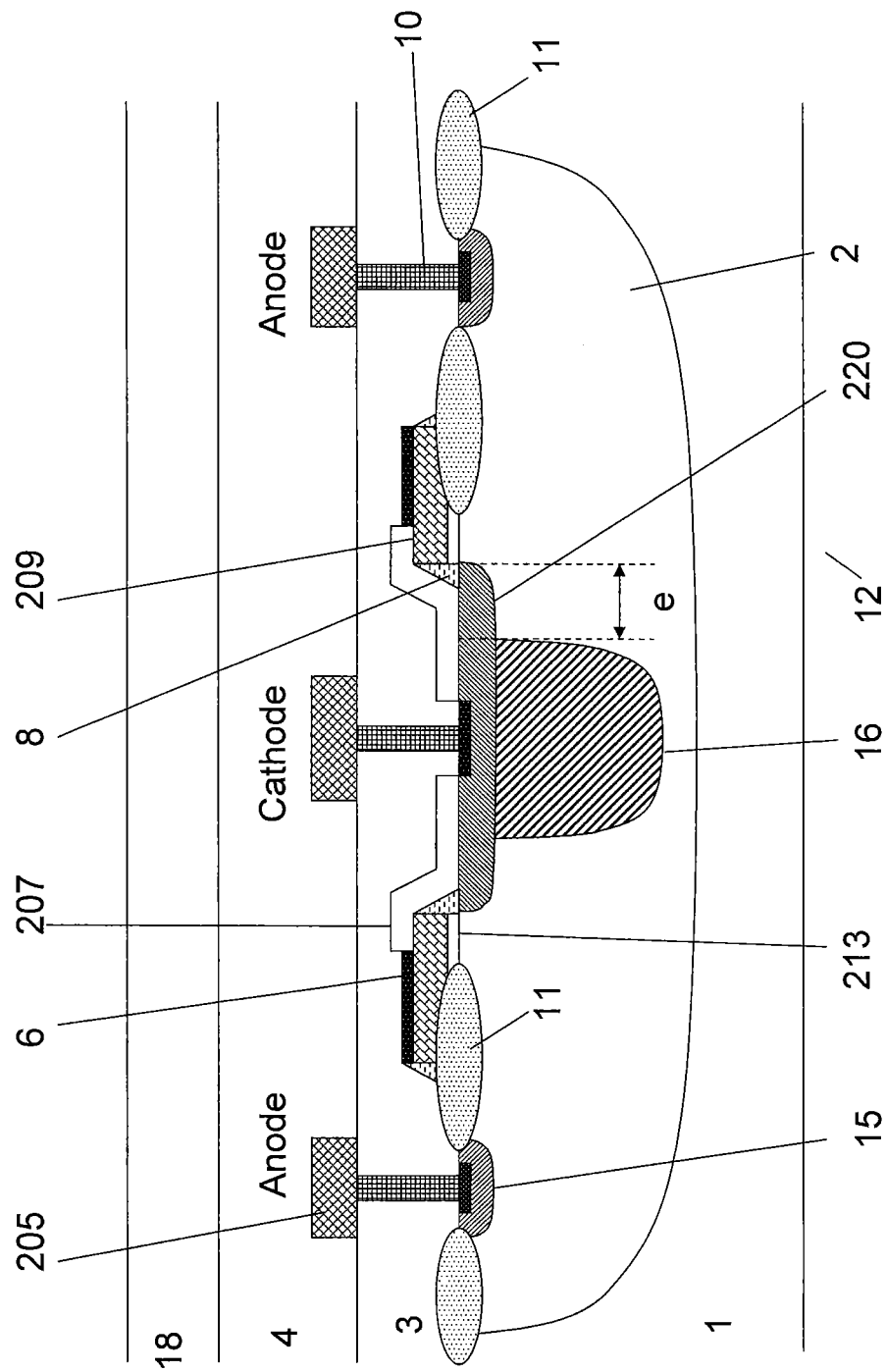

ELECTROSTATIC DISCHARGE PROTECTION DEVICES

FIELD

The present invention relates to electrostatic discharge (ESD) protection devices. Embodiments of the present invention can be used in particular in connection with semiconductor integrated circuits.

BACKGROUND

Electrostatic discharge into a semiconductor integrated circuit (IC) can cause failure of the components unless they are properly ESD protected. This is normally achieved by making special components and circuits which reside in the input/output (TO) regions of the circuit. This invention describes MOSFETs which are suitable for use within input or output protection circuits. At least some embodiments of such MOSFETs can be manufactured using mainstream CMOS processing techniques so that they can exist alongside many other useful components on/in a single integrated circuit.

ESD pulses tend to have a very short duration and can be discharged into an IC through its electrical terminals. Hence these input/output (TO) terminals should be tolerant to withstand very fast transient, high voltage spikes. This is normally accomplished using protection circuits composed of diodes, resistors and MOSFETs. For example, and without limitation, NMOS and PMOS devices may be used.

One IO protection scheme, see FIG. 1, comprises the addition of diodes 106, 108 connected to the power rails 102, 104. In FIG. 1, a bond pad 110 is shown. This is connected to other circuits 112 via line 111. The bond pad 110 allows external connections to be made to circuits 112 (the structure of circuits 112 is normally too small for external connections to be made directly to circuits 112), via terminals on the bond pad. Accordingly, the terminals of the bond pad 110 provide the IO functionality of the chip 100. Whilst only one line 111 is shown in FIG. 1, a separate line is provided for each terminal of the bond pad 110, and a set of diodes such as diodes 106, 108 is normally provided for each line. The terminals of the bond pad 110 are normally exposed. This is why they constitute an ESD risk (the bond pad 110 is effectively a gateway for ESD to reach other circuits 112 on the chip). The description will proceed as if there was only one line and one terminal on the bond pad 110, but it will be understood that normally there are several.

The diodes 106, 108 are reverse biased when the chip 100 is powered and conduct minimal current in this operational mode. If the voltage on the IO exceeds (due to ESD) the power supply voltage Vdd, the upper diode 108 will forward bias to the Vdd rail 104. Conversely, a negative voltage to the IO will forward bias the lower diode 106 to the Gnd rail 102. Hence the voltage level at the pad terminal (i.e. at node 114) is "clamped" within a voltage range which can be tolerated by the rest of the circuit, i.e. between 0V and Vdd.

If the Vdd 104 is unconnected, an ESD pulse can reverse bias the lower IO diode 106 connected to the ground rail, until it conducts due to reverse bias breakdown. A similar situation can occur for reverse polarity ESD pulses applied to the upper Vdd connected diode 108 if the ground 102 is disconnected. When designing ESD protection schemes one should therefore give consideration to the reverse bias breakdown properties of these IO connected diodes.

Input protection diodes may be made e.g. using MOSFETs, for example large MOSFETs, where the gate, source and body are connected together for the power rail (Vdd or ground) connected side of the diode, and the drain node forms the side which is connected to the pad, at node 114.

In a typical configuration a NMOS transistor would be used where lower diode 106 is shown in FIG. 1, and a PMOS transistor would be used where upper diode 108 is shown. The drains of both transistors would be connected to node 114 (pad). The gate, source and body of the NMOS transistor 106 would be connected together to ground 102, and the gate, source and body of the PMOS transistor 108 would be connected together to Vdd 104.

For NMOS devices this is commonly known as ggNMOS connection configuration (grounded gate NMOS) because of the connection of the gate of the NMOS to the ground rail. As described above, the wiring for the PMOS device is equivalent (but opposite) for the power supply connection, Vdd rail 104.

For outputs a similar arrangement can be used. In that case the IO buffer transistors are usually large NMOS and PMOS devices which have intrinsic reverse biased diodes on the drain nodes relative to the source, body and power rails. The gate connections of the output drivers are connected to the internal output signal wiring of the IC.

Furthermore, additional protection diodes can be added between the Vdd and ground rail in order to protect the IC from ESD surges between the power connections. Alternatively a power supply clamp circuit 116 may be employed to limit the voltage surge between power rails in the event of an ESD surge between Vdd and ground. Diodes and clamps can also be used in more complicated ways when multiple power supplies are used on the IC. High voltage ICs are also made where the circuit controls the switching of high voltages which are not available as power supply connections to the component. These operation requirements further complicate the design of suitable ESD protection schemes compared to the simple example of FIG. 1. Nevertheless, FIG. 1 illustrates the basic idea of how an ESD protection circuit can be made on an IC.

For simplicity this description will focus next on the NMOS component, which is representative of MOSFET behavior in general when it is used within ESD protection circuits.

ESD pulses can be discharged into an NMOS protection device by a combination of reverse bias breakdown of the drain to body diode and also by breakdown of the parasitic bipolar NPN junctions between source, body and drain. The challenge of ESD protection is to ensure that the breakdown current flowing into the MOSFET is, as much as possible, uniformly spread over the whole device—or at least more uniformly spread than it would be without the ESD protection. Localised current flows can lead to self heating damage of the component in "hot spots". Also, the resistance of the device once it conducts should be low so that resistive self heating is minimized, or at least reduced. Also, the current from the ESD pulse can be discharged with minimal voltage rise within the IC. High voltages can also be damaging to the IC, e.g. causing destructive breakdown of thin insulating layers, e.g. the gate dielectric. ESD protection devices tend to have a large physical area compared to many other components. They are large to spread out the energy of the ESD discharge and also to minimise their series resistance, which is inversely proportional to their size. A typical configuration for a protection device is an NMOS made from a number of long parallel gate fingers with alternate connections to the drain, source and body regions. Small distances between drain and source and drain and body are therefore maintained.

However, in order to promote a more uniform current flow in an ESD protection structure, small resistive regions can be formed which are associated with the drain side of the MOSFET. These are often termed "ballast resistors" and may be constructed in a number of ways. Referring to FIG. 2, one common technique is to make the MOSFET with a slightly longer region of drain diffusion resistance 20 between the drain side of the channel and the drain ohmic metal connection. However, a problem arises in this technique: The process of forming the device uses silicide (e.g. the silicide 15 of the body contact). There is therefore the risk that—without additional precautions—silicide could also form in other areas, for example on drain diffusion resistance 20, which would then be shorted, given that an overlying metallic silicide would have a low series resistance. Accordingly, a thin stripe of silicide blocking material 7 is used. This may be an insulating dielectric layer. By overlapping the gate 9 on the drain side with silicide blocking material 7 and extending this towards the drain connection the risk of silicidation of the diffusion region 20 adjacent to the MOSFET channel is avoided. The diffusion region 20 (or drain diffusion) then acts as the ballast resistor.

On the source side the diffusion 14 can be fully silicided. The gate 9, where it is only partially overlapped by silicide blocking material 7, can also become partly silicided to keep its resistance low. Alternatively the gate 9 could be overlapped completely by the silicide block 7, if it would otherwise become too narrow to form silicide upon it in a self-aligned silicide (salicide) process. Other process variants include separately silicided gates or using metallic gates where the presence of a silicide block layer on the gate is less problematic.

A cross-section of a typical, conventional ESD protection NMOS structure as described above can be seen in FIG. 2.

Several additional techniques have been used to improve modern ESD MOSFETs. One method commonly used is to modify the drain junction diffusion so that it is deeper and the doping profile is a more graded diffusion region (not an abrupt doping transition), such as diffused region 19—see FIG. 3. The junction depth is indicated by "xj" in FIG. 3. This tends to modify the behavior of the junction breakdown and forces ESD current flow deeper into the semiconductor, where it causes less damage to the MOSFET. Also, the rounding and more diffused grading of the junction edge lowers the electric field within the transistor, which is beneficial to mitigate any ESD surge damage.

SUMMARY

The present inventor has appreciated that one problem associated with the above technique is the need to add a special, extra implanted layer into the CMOS process to make the deeper, graded junction. This tends to increase the cost and complexity of the processing needed to make these components. Another issue is that the physical junction depth increase on the drain may be detrimental to the off-state leakage and short channel electrical behavior of the transistor. Consequently the device is either less ideal or needs to be made with a longer physical channel length to recover electrical long channel behavior. This can make output driver devices more leaky in their off-state and have non-ideal electrical output characteristics in their on-state if they are short channel, or alternatively may lower the output drive current and impact on switching speed if they need to be made longer channel.

Other techniques exist to implant the drain region with the opposite type of doping, either around the sides or immediately beneath the junction. Fairly large doping levels are required in either case and these implants tend to be fairly shallow with implanted and diffused depths either the same as or slightly deeper than the transistor drain junction diffusion implant. By changing the doping in the near vicinity of the junction, the reverse bias breakdown behavior can be adjusted to lower voltage values which are more favorable for ESD protection. But opposite doping around the edges also tends to upset the transistor electrical behavior by perturbing it relative to other components on the IC. For high doping levels immediately under the heavily doped junction this will normally increase the reverse bias parasitic capacitance and also increase the reverse bias junction leakage of the diode. The inventor has appreciated that these are unwanted side effects.

It is an aim of at least some embodiments of the present invention to control the breakdown of the component without adversely impacting its electrical behavior.

Layout patterns used to make the transistors may also be important. Most of the conduction will be concentrated between drain and source/body, under the gate fingers of the transistor pattern. But there are extreme edges of the drain diode pattern between the gate fingers which have silicided junction diffusion all the way up to the outer edge of the active area. The reverse leakage and breakdown at these edges may be the weakest point of the drain diode, for some transistors. Hence the survivability of the diode to an ESD pulse may be limited by the electrical behavior at these edges. The inventor has appreciated that generally this weakness manifests itself as non-uniformity of ESD protection and poor scaling of the current carrying ability with increasing transistor gate finger widths.

The present invention seeks to address the aforementioned problems.

In one aspect, the present invention provides a semiconductor device as per claim 1 or 31, as filed, e.g. a transistor.

An ESD protection device according to the present invention does not need to be in the form of a transistor but can also be provided in the form of a diode. More generally, any suitable device incorporating diode features could be used.

In a second aspect, the present invention provides a semiconductor device as per claim 32, as filed.

BRIEF DESCRIPTION OF DRAWINGS

Some embodiments of the invention will now be described by way of example only and with reference to the accompanying drawings, in which:

FIG. 14 shows a sectional view of an ESD protection diode according to an embodiment of the present invention.

DETAILED DESCRIPTION

Figure 1:
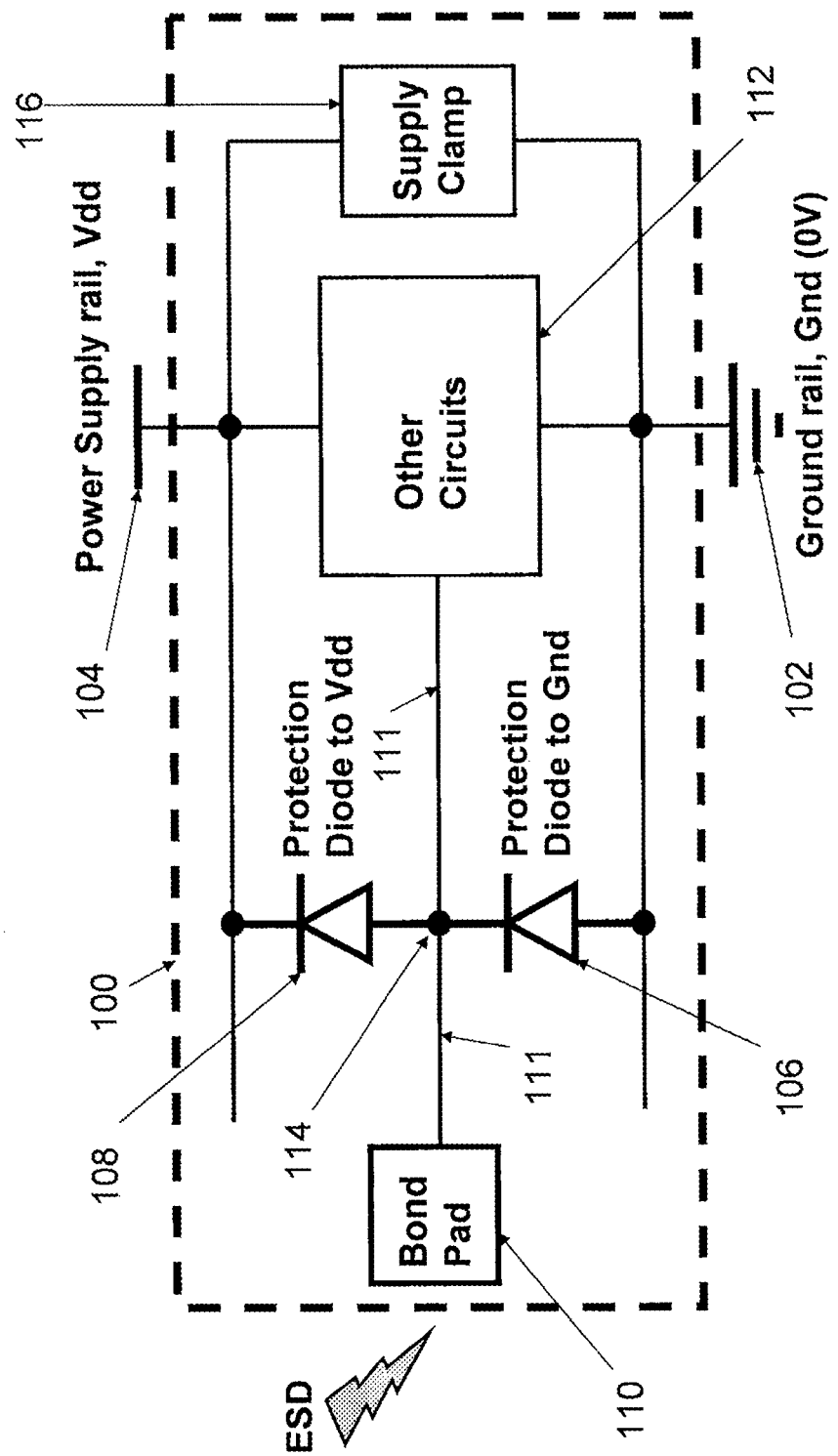
FIG. 1 shows a simplified ESD protection circuit for an IC chip IO pad (prior art).
Figure 2:
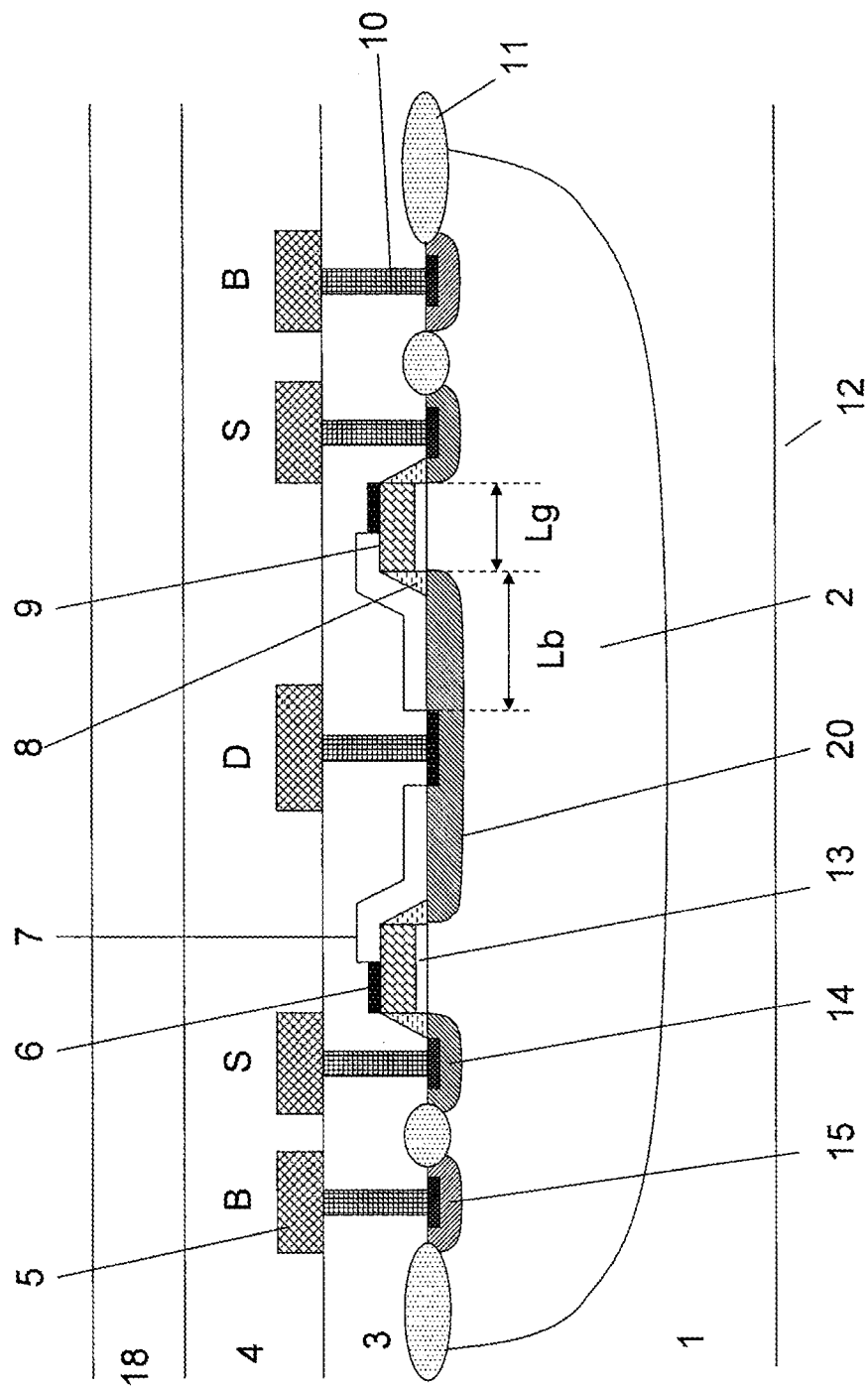
FIG. 2 shows a sectional view of an ESD protection transistor (prior art).
Figure 3:
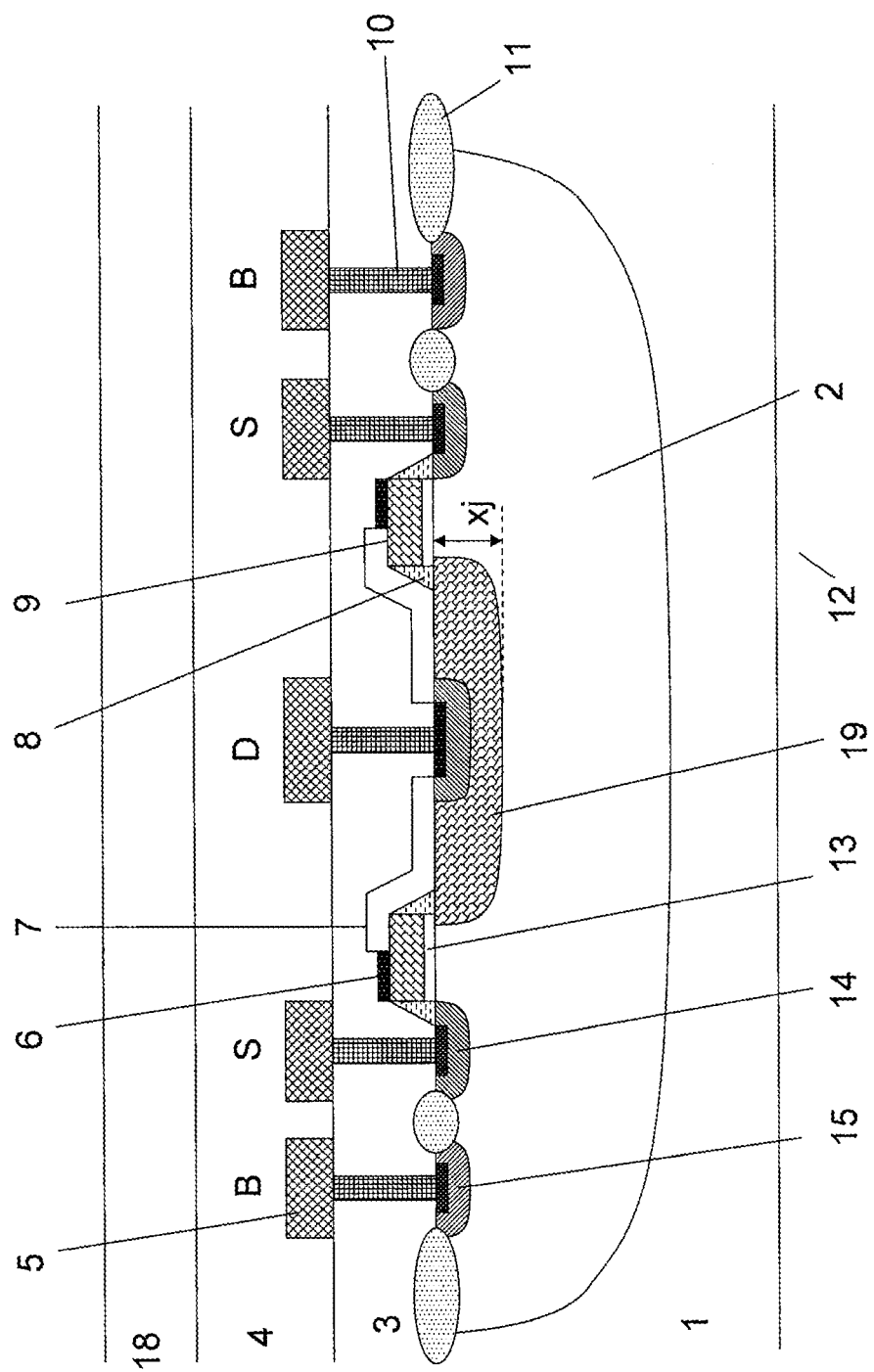
FIG. 3 shows a sectional view of an ESD protection transistor (prior art).
Figure 4:
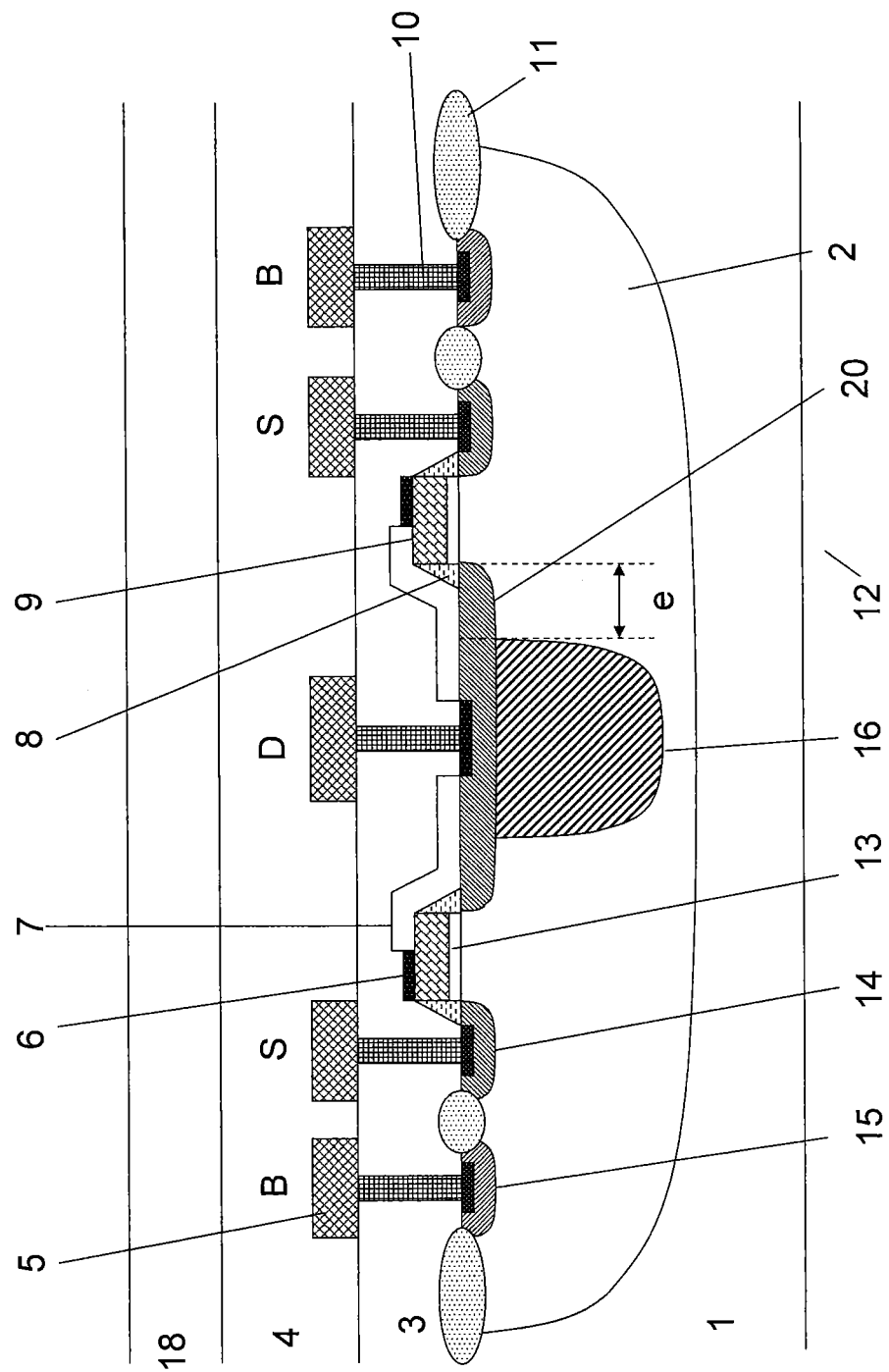
FIG. 4 shows a sectional view of an ESD protection transistor according to an embodiment of the present invention.

A cross section of a MOSFET according to an embodiment of the invention is shown in FIG. 4. Most features of the transistor, including the transistor channel, are the same as the transistor shown in FIG. 2 and are also the same as any standard NMOS used on the rest of the IC. The same reference signs as in FIG. 2 are used, to denote corresponding features. The MOSFET of FIG. 4 is again provided with a doped p-well 2, in or on which the drain, gate, source and body contacts are formed. The electrical switching behavior of the ESD protection transistor of FIG. 4 will be the same as the rest of the NMOS components on the IC. Off-state current and on-state drive capability are maintained. Also the breakdown voltage of the drain junction immediately at the channel edge, under the gate 9, 13 is the same as a standard NMOS. Within (or under) the region used as an ESD ballast resistor 20 and drain connection a deeply implanted region 16 is provided, which the FIG. 2 prior art does not have. Region 16 is a fairly lightly doped p-type region contained within p-well 2. It is offset from the edge of the gate 9, 13 by a small distance labelled "e" in FIG. 4. Another way of describing it is by saying that it is offset from an outer edge of the drain diffusion 20, or from an outer edge of the active area associated with the drain.

In experiments by the present inventor, doping levels of about 9e12/cm2 (boron, 200 keV) up to 9e13/cm2 have been used for the p-doped region 16. The net doping of the silicon region is about 1e17 atoms/cm3 up to 5e18 atoms/cm3—typically about 1.3e18 atoms/cm3 with a junction diffused depth of about 1 um, although depths of about 2 um, or between 0.1 um and 10 um are also possible.

In experiments by the present inventor, the conditions were adjusted so that the value of "e" was from about 0.1 um to about 1.4 um, with 0.4 um being a typical value for "e".

This extra p-type doping (i.e. region 16) reduces the breakdown voltage of the diode vertically under the drain diffusion, but only within the central regions of the drain junction. It does not (significantly) alter the breakdown voltage at the outer edges of the n+ diffusion 20, which remain at, or close to, their original higher value. Thus ESD surge currents tend to conduct, in one case, into the central part of the drain diode into the p-type region 16 beneath because the conduction starts at the point where breakdown begins, i.e. where the junction has its lowest breakdown voltage. Thus the high current tends to be kept away from the sensitive transistor channel regions, where the transistor is vulnerable, so that the least damage is done. The point of breakdown occurs within a large, robust diode area rather than at transistor edges.

The p-type zone 16 may be created using a standard process implant without the need to add a special ESD implant layer. This may save cost and complexity. The implanting of a p-type implant 17 (see FIG. 8-10) which is already used in the process to suppress the parasitic NMOS field leakage at the outer edges of the active area, under the field oxide 11, could be used to implant within the drain connection zone of the active area to form the drain p-type region 16. Some processes have more than one p-well already, for example if they offer different voltage CMOS on the same IC. In those cases a simple re-use of an existing implant minimizes the additional cost to make the improved ESD protection components.

Due to the diffused depth of the p-type zone 16 the vertical series resistance into the drain diode is reduced. This is an advantage compared to shallow p-type implanted regions. A deeper p-type region is beneficial for lower series resistance because it acts as a vertical "sinker" diffused connection into the p-substrate.

Figure 9:
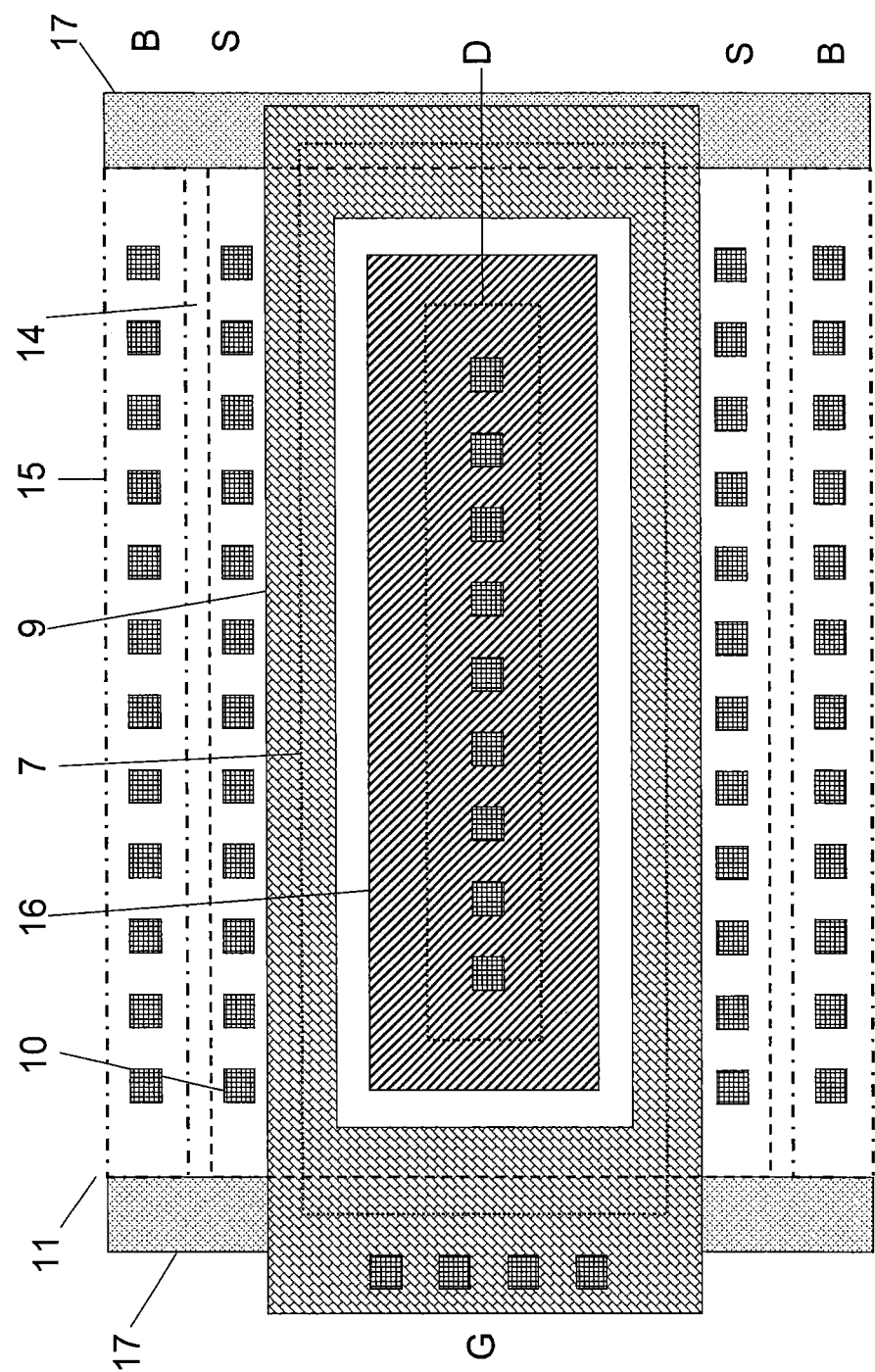
FIG. 9 shows a plan view of an ESD protection structure according to an embodiment of the present invention.
Figure 10:
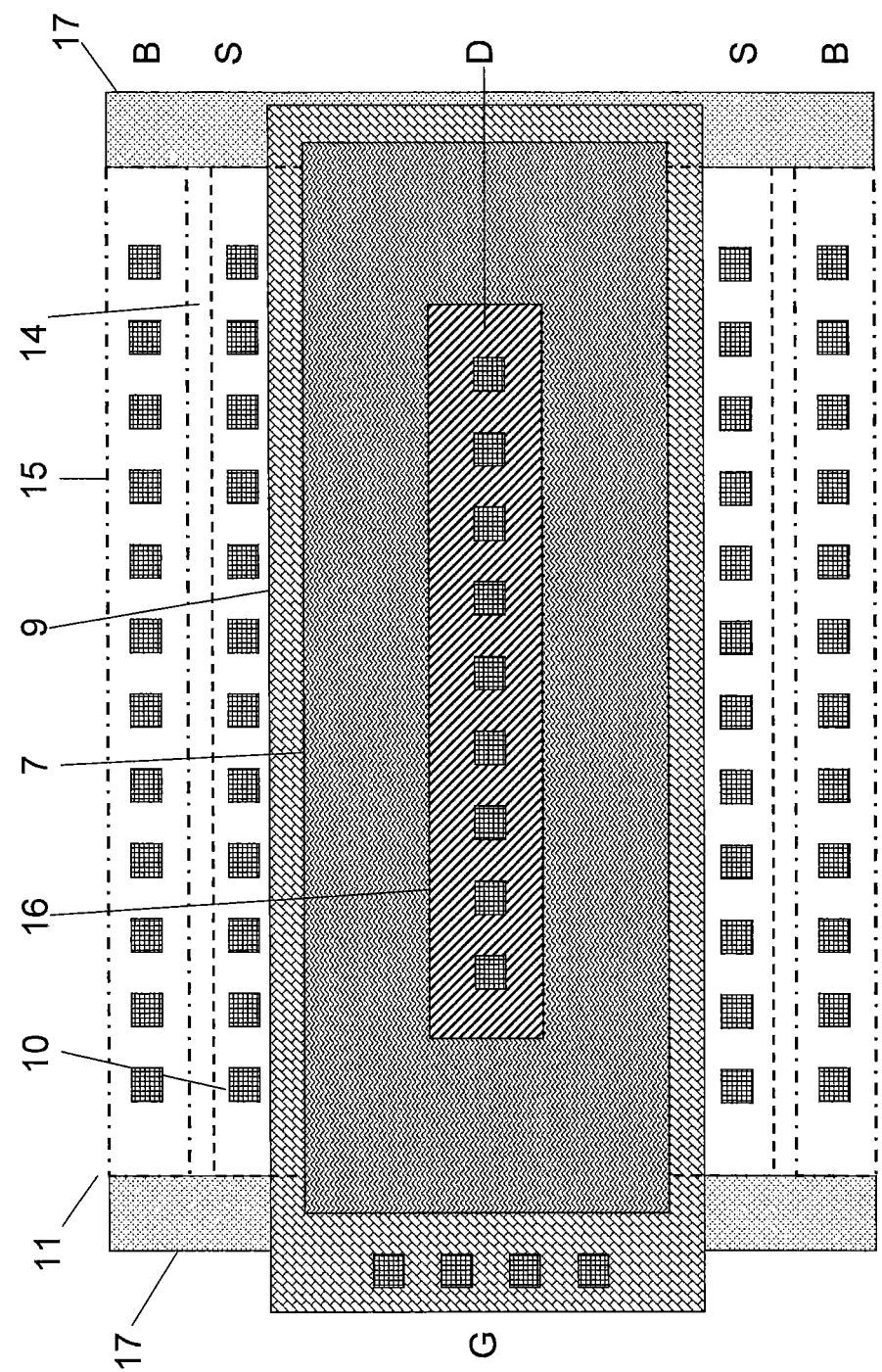
FIG. 10 shows a plan view of an ESD protection structure according to an embodiment of the present invention.

According to certain embodiments the transistor stripe layout is modified to address the problem of extreme edge structures on the outer periphery. FIG. 9 shows a plan view of the modified transistor design, which should be compared to the transistor layout of FIG. 8. At the outer device periphery the gate layer 9 of FIG. 9 overlaps the active area so that it surrounds the drain connections D. The gate layer 9 is formed as a ring. The silicide block layer 7 is similarly arranged as a concentric ring—see FIGS. 9 and 10. Note that FIGS. 9 and 10 show the same device, but the silicide block layer 7 is shown in the foreground in FIG. 10, whereas in FIG. 9 only its edge is indicated. The silicide block layer 7 overlaps the gate over an outer portion (of the silicide block layer 7) and the drain junction active area over an inner portion (of the silicide block layer 7). This layout style aims to ensure that the breakdown voltage of the diode is uniformly the same for the entire central part 16 and not weaker at the edges.

The stripe layout style as shown in FIG. 9 can be repeated many times and stretched in transistor width to make a suitably large ESD protection designed component.

In FIG. 9, the p-type zone 16 is laterally offset from the ring-shaped gate 9 on all sides.

Figure 8:
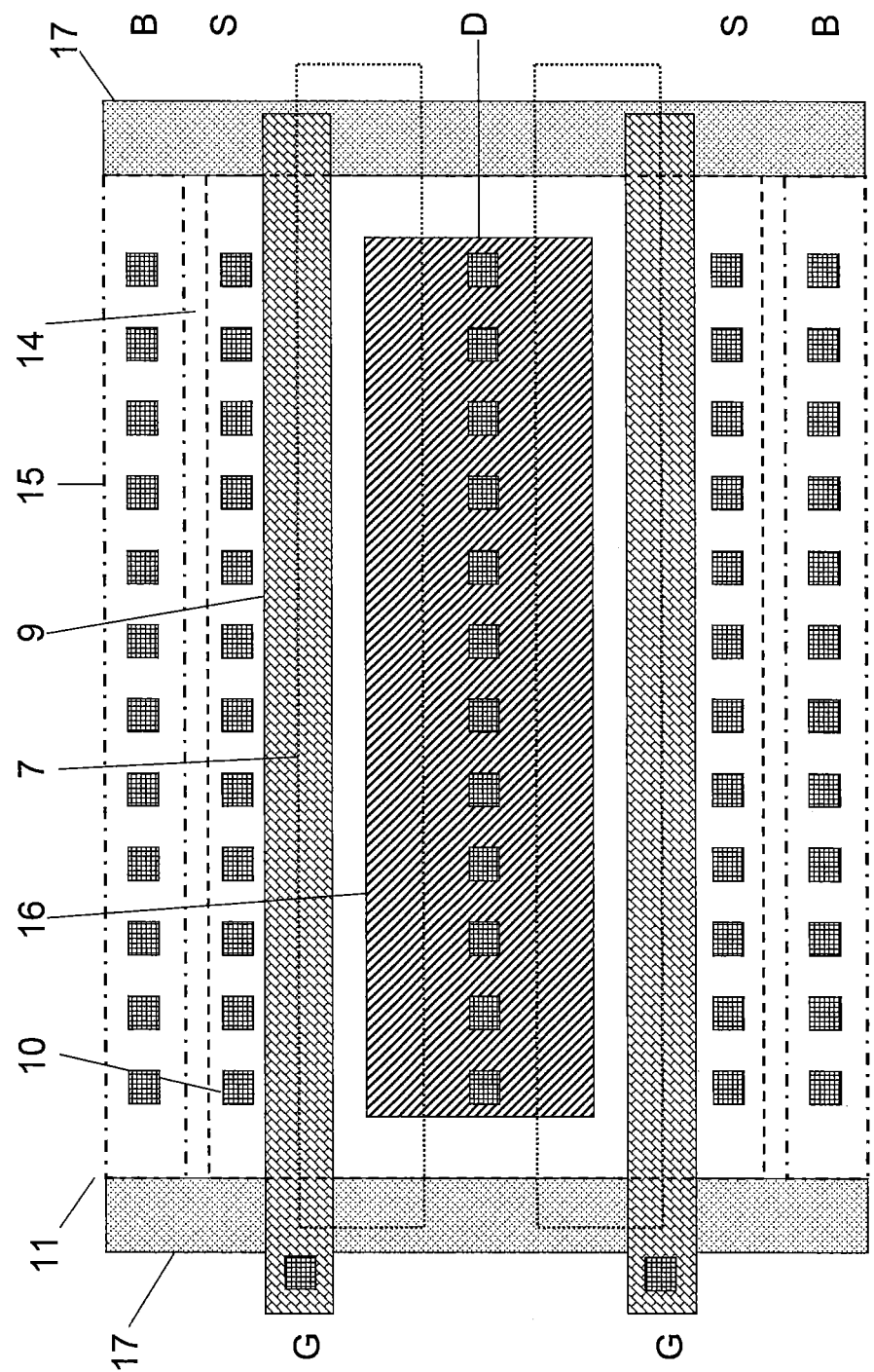
FIG. 8 shows a plan view of an ESD protection structure according to an embodiment of the present invention.

In FIG. 8, the gate is not formed as a ring but as two stripes. The top and bottom edges (according to the orientation of the device as per FIG. 8) of the p-type zone 16 are again laterally offset from the gate 9. No portion of the gate extends along the remaining two edges of the p-type zone 16. However, at those two remaining edges (and also at the top and bottom edges, i.e. at all edges) the p-type zone 16 is offset from an outer edge of the active area of the device, or from an outer edge of drain diffusion 20.

Figure 11:
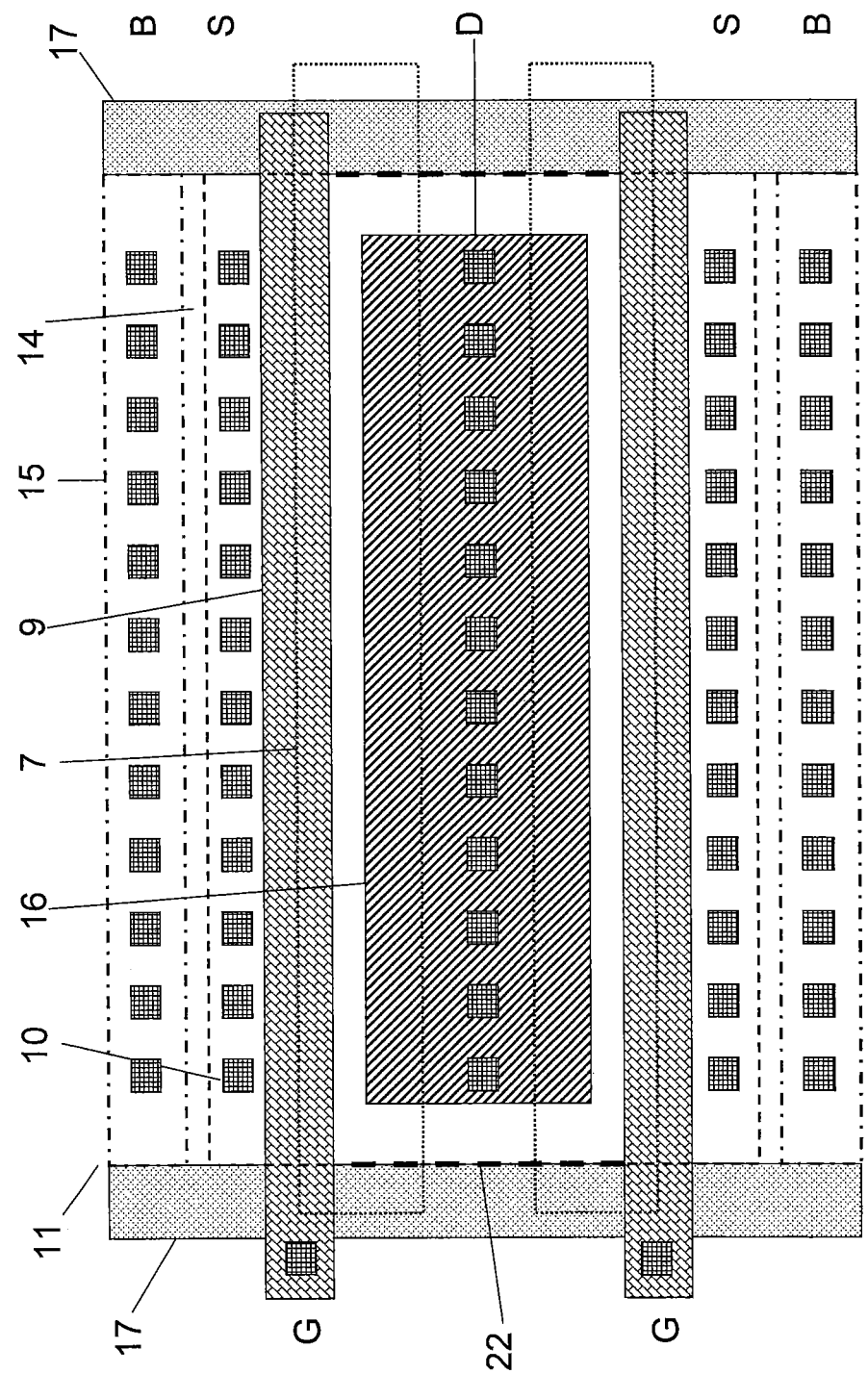
FIG. 11 shows a plan view of an ESD protection structure according to an embodiment of the present invention.
Figure 12:
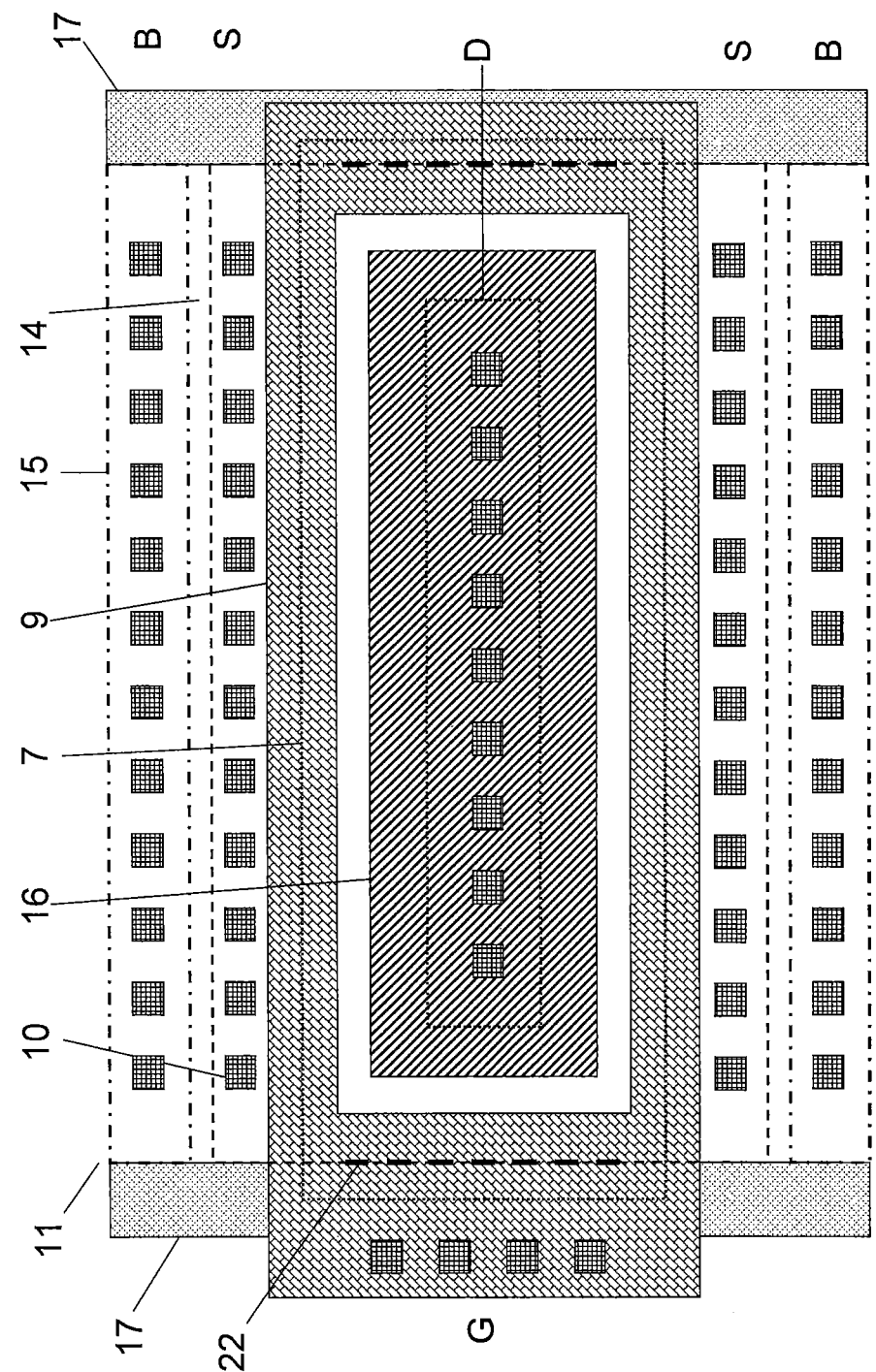
FIG. 12 shows a plan view of an ESD protection structure according to an embodiment of the present invention.

Relevant portions of the outer edge of the active area of the device are shown in FIGS. 11 and 12, whereby FIG. 11 corresponds to FIG. 8, and FIG. 12 corresponds to FIG. 9. The outer edge of the active area is represented by dashed line 22, at the inside edge of field oxide 11. As described above, ring shaped gate 9 covers the active area outer edge 22 in FIG. 12. In FIG. 11 the gate is provided as two parallel strips, and these do not cover dashed line 22. In both FIGS. 11 and 12 the p-type zone 16 is spaced from (or laterally offset from) the active area outer edge 22.

The capacitance of the transistor is not severely compromised according to embodiments of the invention, because the doping level under the diffused n+ junction 20 remains fairly lightly p-type doped. The capacitance of the junction is dominated by the edges of the diffused part 20 where it meets the active area edge and also the edges where it meets the transistor channel at the gate edges. This is substantially unchanged by the addition of the inset p-type region 16. There is only a very small capacitance increase to the central part of the diode compared to a diode where the p-well 16 is absent. This central capacitance makes only a small contribution to the total capacitance of the junction. Hence the parasitic capacitance of the transistor extrinsic diode is only very slightly more than a standard NMOS. Diode reverse bias leakage is likewise approximately the same as an NMOS without the inset p-type doping 16, because it is dominated by the leakage around the edges of the n+ diffusion 20, with only a small contribution from the internal, middle part of the diode.

Transistor off-state leakage is not (or not significantly) impacted because the extra p-type implant 16 under the drain diffusion 20 is offset from the gate edge so it has no (significant) effect on the transistor channel region.

The ballast resistor is not (or not significantly) impacted because the lightly doped p-type 16 has only a negligible effect on the resistance of the heavily doped n+ diffusion 20. Hence the drive capability of the transistor on-state is not (significantly) changed by the inclusion of the p-type region 16. According to some embodiments, from an electrical circuit point of view, a ballast resistor in the drain is the only difference compared to a standard NMOS design as shown in FIG. 2. The drive current is comparable or equal to the ESD protection structure as shown in FIG. 2, and also comparable to other devices which may be made on the same IC and which do not have a p-type region implanted within the drain n+ diffusion.

Figure 5:
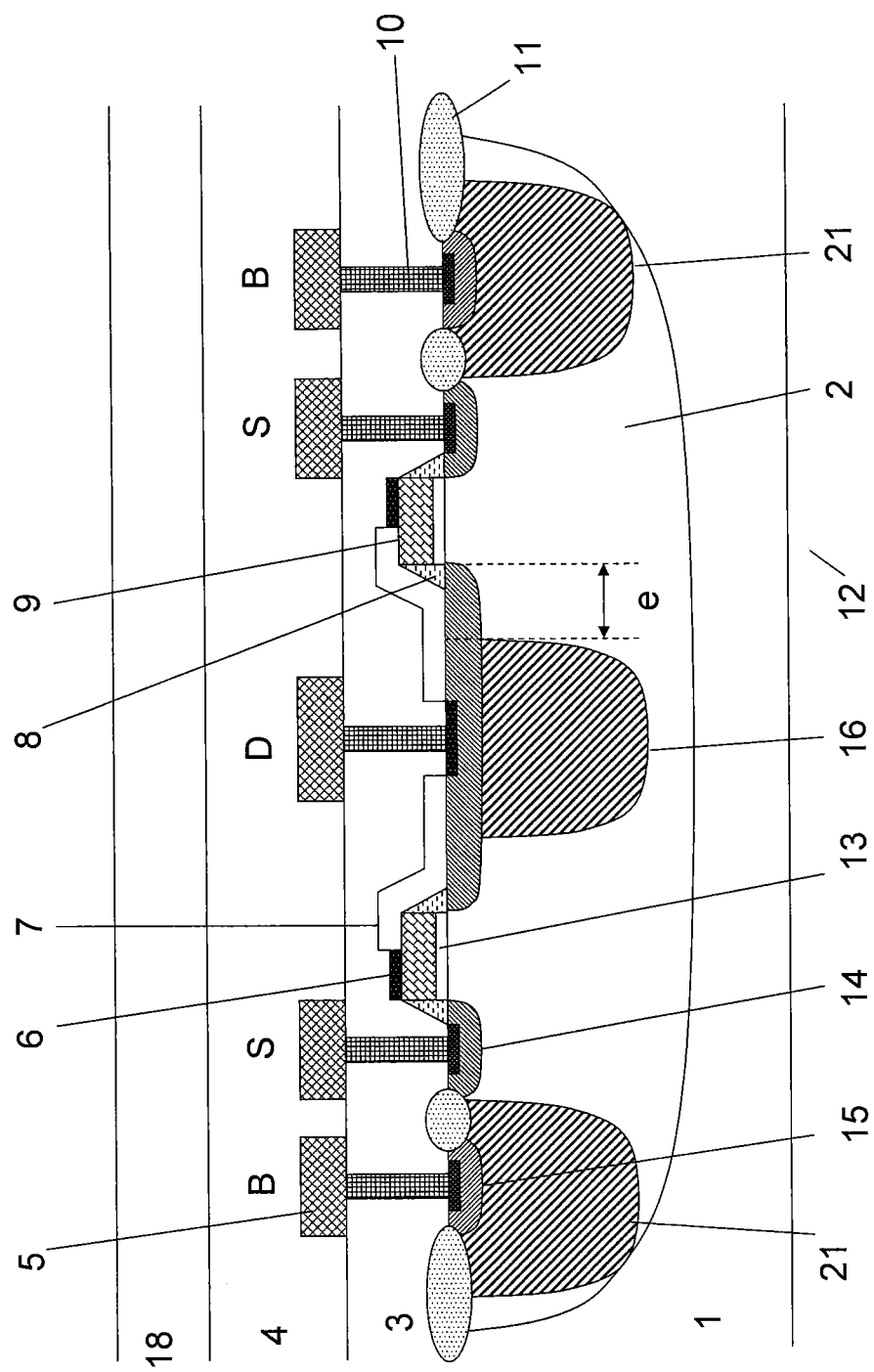
FIG. 5 shows a sectional view of an ESD protection transistor according to an embodiment of the present invention.

Other embodiments are possible. As per FIG. 5, if an extra p-type region 21 is also added to the body connection then this can further reduce the series resistance. The p-type "sinker" diffusion 21 reduces vertical series resistance of the body connection into the p-substrate. Lower resistances mean lower power dissipation when the ESD current flows and hence less self heating—hence less damage to the device. The maximum current carrying ability of the component can thus be increased.

The additional p-type region 21 may have similar dimensions as p-type region 16 and would also normally be contained within p-well 2.

Figure 6:
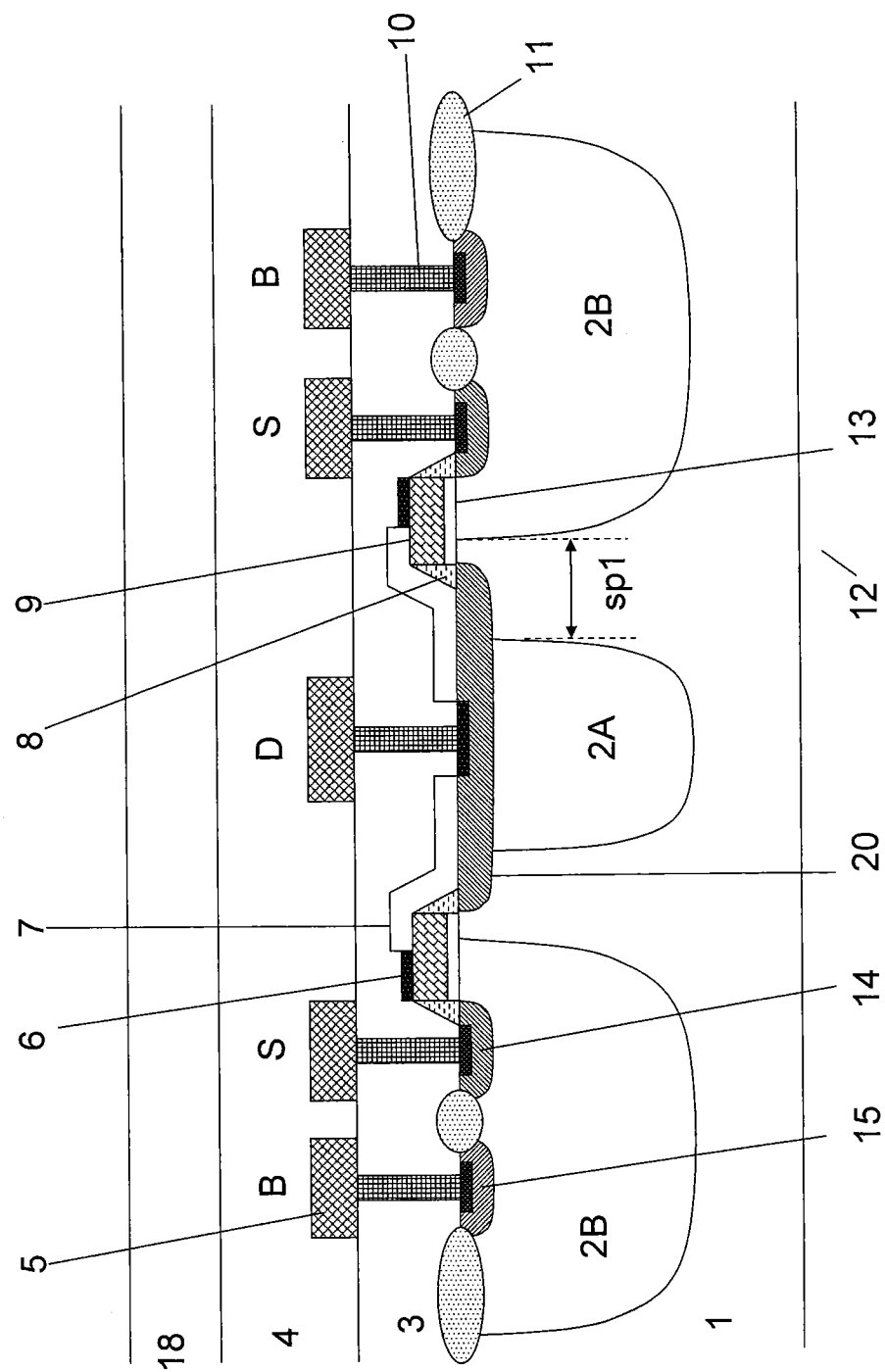
FIG. 6 shows a sectional view of an ESD protection transistor according to an embodiment of the present invention.

In some process flows there are no special field suppression implants. In these cases there is one type of p-well (unlike in e.g. FIG. 4, where there is a large p-well 2 and, within that, a smaller p-well 16). FIG. 6 shows how the invention can still be created as a second embodiment. In that case the p-well 2B under the transistor needs to be offset by a small gap from the p-well 2A which is made under the drain n+ diffusion (this gap is labelled as "sp1" in FIG. 6). The NMOS will still conduct as normal since the light p-type diffusion 2B will be depleted and inverted by the gate voltage. The inversion channel will still reach the n+ diffusion 20.

Figure 7:
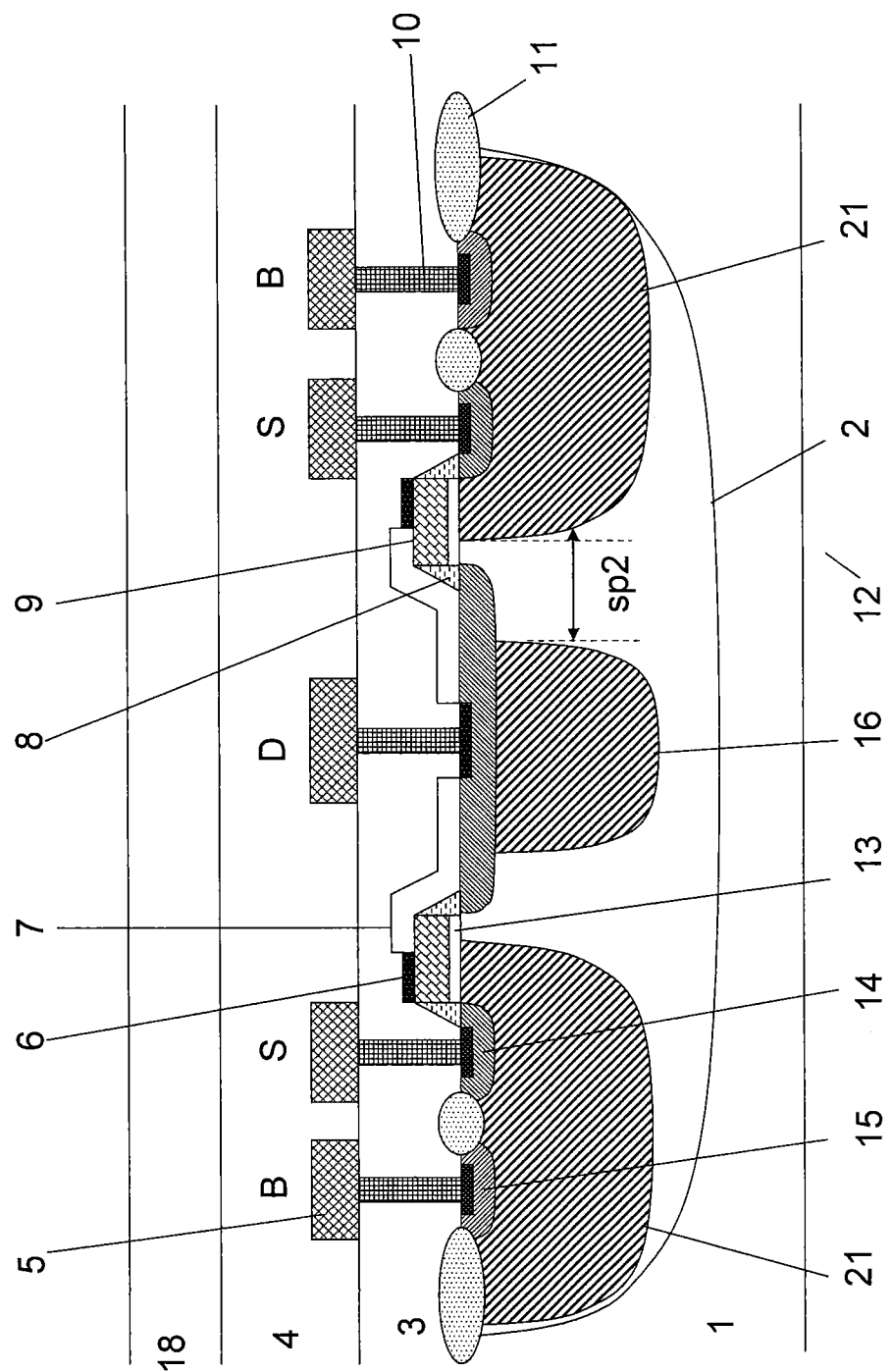
FIG. 7 shows a sectional view of an ESD protection transistor according to an embodiment of the present invention.

In the third embodiment, FIG. 7, the feature of a small gap "sp2" between p-well areas 21 and 16 is created and the deeper p-type zone 2 is also present. This embodiment may be useful e.g. in cases where the substrate doping is n-type and needs to be implanted p-type to make a functional NMOS device.

Figure 13B:
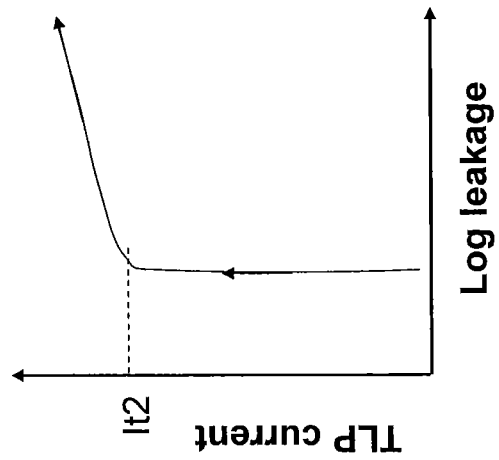
FIGS. 13A and 13B show typical snapback and leakage curves for an ESD device, measured by TLP (transmission line pulse).
Figure 13A:
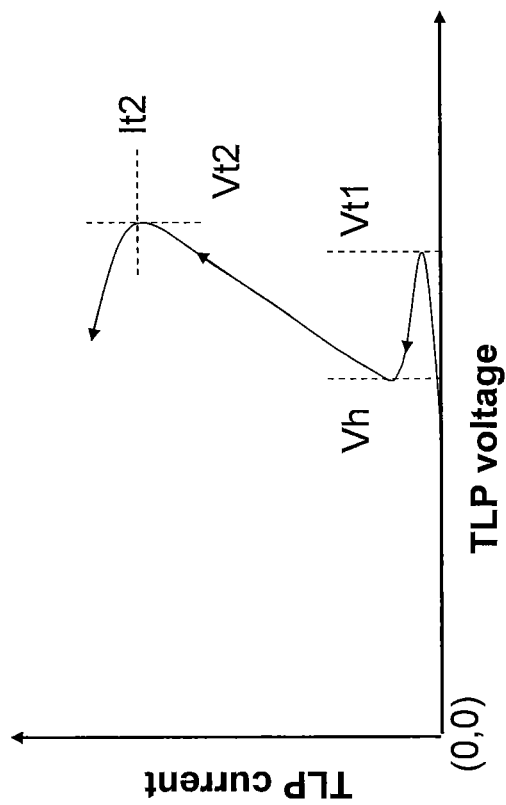

FIGS. 13A and 13B show a typical transmission line pulse, TLP trace for an embodiment of the invention configured as a ggNMOS ESD protection component. TLP is a method of checking ESD equivalent operational IV curves using a fast pulsing technique with pulse times of about 100 ns. FIG. 13A represents the TLP snapback IV trace which is the pulse voltage (x-axis) versus pulse current (y-axis). FIG. 13B represents the leakage measured on the component after each pulse (x axis, log scale), plotted versus the current measured at the pulse (y-axis). The two plots are created so that the two y-axis scales are the same.

Referring to FIG. 13A, the Vt1 point is the voltage where there is the first snapback breakdown in the transistor and it triggers into a conducting state in reverse bias, e.g. when an ESD event happens. Once snapback happens, the voltage drops quickly to the holding voltage, Vh and the device is then in a fully conducting state. Vh is larger than the maximum Vdd power supply voltage, so that the device does not have latchup sensitivity issues in normal circuit use. Above Vh the current increases approximately linearly; the current flows into the device uniformly. There is some heating and power dissipation but no irreversible damage, as can be observed by the straight line, low value, leakage current plot in FIG. 13B. This part of the curve represents the component operating as a (good) ESD protection device. It can conduct away the ESD pulse current in a non-destructive way, whilst maintaining a reasonably low voltage on-chip to protect the other components in the integrated circuit.

A second breakdown is seen at a high current It2 and voltage Vt2, whereby Vt2>Vt1. The ESD protection device then suffers irreversible thermal and electrical damage, e.g. the device starts to melt, burn and fuse, which destroys it. Resistance becomes effectively negative (hence unstable) on the TLP curve. Beyond It2, the leakage suddenly increases on the right hand curve, indicating device damage. This It2, Vt2 point is identified as the maximum limit of operation for the component when used as an ESD protection device. Since an aim of embodiments of the invention is to better protect devices from ESD damage, the current and voltage caused by the ESD needs to be below It2, Vt2 so that the ESD pulse can be discharged without causing any device damage.

Using embodiments of this invention Vt2>Vt1 can be achieved, which is a necessary condition for uniform conduction throughout the device at the point when it fails. This feature helps to maximise the ESD current capability for a given device size (i.e. number of stripes).

It is the maximum ESD current which is approximately correlated with ESD HBM protection strength. Embodiments of this invention can achieve It2 values of about 10 mA/um (equivalent to >8 kV ESD HBM, human body model). Standard component styles which were made using the same CMOS technology, made the same size but without this invention only achieve about half of this ESD robustness.

FIG. 14 shows a sectional view of an alternative embodiment. The ESD protection device of FIG. 14 is provided as a diode. Features of FIG. 14 having the same function as features shown in FIG. 4 carry the same reference number. Features having a similar function as features shown in FIG. 4 carry a reference number which increased by 200 when compared with FIG. 4.

Comparing FIGS. 14 and 4, one will see that the drain has been replaced by the cathode of the diode, and the body contact has been replaced by the anode 205. The cathode is again provided with resistive region 220 (cathode diffusion), under which is formed the p-type region 16. This is offset or laterally spaced from an outer edge of the cathode diffusion, as indicated by distance "e".

The outer edges of the diode can be terminated using a polysilicon guard ring 207, which overlaps the cathode diffusion 220. Whilst not essential, the polysilicon ring 207 would normally be connected so as not to be floating.

Labels used in the figures include:

1—Single crystal silicon epitaxial layer; e.g. high quality, lightly doped semiconductor, e.g. p-type 2—Doped p-well_1; e.g. diffused implanted semiconductor, p-type impurity 3—Insulating dielectric material used between semiconductor and metal wiring layer; e.g. silicon dioxide; ILD 4—Insulating dielectric material above and also between metal wiring layer(s); e.g. silicon dioxide; IMD 5—Metal wiring layer; e.g. aluminium metal 6—Conducting silicide layer; e.g. titanium silicide or cobalt silicide 7—Insulating dielectric layer on semiconductor devices; silicide block 8—Insulating dielectric layer(s) on sides of gate conductor; sidewall spacer 9—Gate conductor; e.g. doped polysilicon layer (n-type for NMOS)

10—Contact connection metal through ILD; e.g. tungsten metal plug

11—Insulating dielectric layer; e.g. silicon dioxide; field oxide

12—Doped semiconductor substrate; e.g. p+ doped single crystal silicon wafer

13—Insulating dielectric layer; e.g. silicon dioxide; gate dielectric

14—Shallow diffused heavily doped semiconductor region; e.g. n+ diffusion source and drain junctions of NMOS 15—Shallow diffused heavily doped semiconductor region; e.g. p+ diffusion body connection of NMOS 16—Diffused implanted semiconductor, p-type impurity; doped p-well_2

17—Diffused implanted semiconductor, p-type impurity; field suppression implant

18—Insulating dielectric material used to protect IC, e.g. silicon nitride passivation 19—Deeper diffused heavily doped semiconductor region; e.g. deeper n+ diffusion used as ESD improvement implant 20—Resistive region; e.g. n+ drain diffusion region 21—Deeply implanted region under body connection 213—Thin dielectric region between polysilicon and substrate It will be appreciated by one skilled in the art that devices according to the present invention do not necessarily have to include all features listed above. Similarly, it is not essential for all devices in the circuit to have the same features and characteristics.

The above description has been made with reference to an IC. It will be apparent that the invention may also find application with discrete devices.

Further, the skilled person will understand that in the preceding description and appended claims, positional terms such as 'above', 'overlap', 'under', 'lateral', 'vertical', etc. are made with reference to conceptual illustrations of a transistor, such as those showing standard cross-sectional perspectives and those shown in the appended drawings. These terms are used for ease of reference but are not intended to be of limiting nature. These terms are therefore to be understood as referring to a transistor when in an orientation as shown in the accompanying drawings.

As described above, the invention is not limited to transistors but also to suitable diodes. Further, NMOS and PMOS are not the only types of transistors suitable for use in the present invention. More generally, the invention may find application with CMOS, BiCMOS or BJT devices, or any device incorporating a diode.

It will be appreciated that all doping polarities mentioned above could be reversed, the resulting devices still being in accordance with the present invention. In the case of the diode as per FIG. 14, this would normally mean that the anode is in the centre of the device, with an anode diffusion, and the additional lightly doped diffusion 16 would be formed under the anode diffusion.

It will be appreciated that embodiments may provide ESD protection not only by virtue of being, or incorporating a diode, but also by virtue of the resistive elements of the device.

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A semiconductor device for electrostatic discharge (ESD) protection, comprising:
   a source;
   a gate;
   a drain connection comprising a silicide layer;
   a drain diffusion fully surrounding laterally and underneath the drain connection, wherein the drain diffusion comprises a resistive region located between an edge of the gate and an edge of the silicide layer of the drain connection; and
   a diffusion region extending from, or located under, the drain diffusion,
   the source, the gate, the drain connection and the diffusion region being located in a well region formed in or on a substrate;
   wherein the diffusion region is laterally spaced from at least one of the gate or an outer edge of the drain diffusion, wherein a doping concentration of the diffusion region is less than a doping concentration of the drain diffusion, and wherein the diffusion region is formed such that a thickness of the diffusion region is more than a thickness of the drain diffusion, and wherein the diffusion region is of a doping polarity opposite to a doping polarity of the drain diffusion, and wherein the diffusion region and the well region comprise a same doping type only.

2. A semiconductor device according to claim 1, wherein the gate forms a ring around the drain connection and the diffusion region.

3. A semiconductor device according to claim 2, wherein the diffusion region is spaced from all sides of the ring.

4. A semiconductor device according to claim 1, wherein the gate comprises an edge towards the diffusion region and the lateral distance between said edge and the diffusion region is between 0.1 μm and 0.8 μm.

5. A semiconductor device according to claim 1, wherein said drain connection is laterally separated from an edge of the gate towards the drain connection by the resistive region.

6. A semiconductor device according to claim 5, wherein the distance between the edge of the gate and the drain connection is between 2 μm and 3 μm.

7. A semiconductor device according to claim 1, wherein, at the surface of the device, a silicide blocking layer is formed between the drain connection and the gate.

8. A semiconductor device according to claim 7, wherein the silicide blocking layer forms a ring around the drain connection and the diffusion region.

9. A semiconductor device according to claim 8, wherein the ring overlaps with a portion of the gate towards the drain connection and with an active area adjacent the drain connection.

10. A semiconductor device according to claim 1, wherein the diffusion region is formed under a central portion of the drain diffusion but not under the edges of the drain diffusion.

11. A semiconductor device according to claim 1, further comprising a semiconductor body disposed in or on the substrate, wherein, at the surface of the device, the body is laterally spaced from the source.

12. A semiconductor device according to claim 11, wherein the well region excludes the body.

13. A semiconductor device according to claim 11, further comprising an additional diffusion region extending from, or located under, the body.

14. A semiconductor device according to claim 13, wherein the additional diffusion region is laterally spaced from the diffusion region.

15. A semiconductor device according to claim 13, wherein the diffusion region and the additional diffusion region are contained in the well region formed in or on the substrate.

16. A semiconductor device according to claim 11, further comprising an additional diffusion region extending from the surface of the device towards the substrate and being formed in a region under the body, source and at least a portion of the gate.

17. A semiconductor device according to claim 16, wherein the additional diffusion region is laterally spaced from the diffusion region.

18. A semiconductor device according to claim 16, wherein the diffusion region and the additional diffusion region are contained in the well region formed in or on the substrate.

19. A semiconductor device according to claim 1, wherein the device is arranged to carry a sufficiently large current when a reverse bias voltage is applied to the drain region relative to at least one of the source or gate so as substantially not to cause permanent damage to the device.

20. A semiconductor device according to claim 1, configured such that, in an OFF-state, when a voltage of more than a first breakdown voltage is applied to the device, current conduction occurs in the device.

21. A semiconductor device according to claim 20, wherein permanent damage of the device occurs when a second breakdown voltage, which is higher than the first breakdown voltage, is applied to the device.

22. A semiconductor device according to claim 21, wherein the second breakdown voltage is sufficiently greater than the first breakdown voltage such that substantially uniform current conduction is achieved throughout the device between the first and second breakdown voltages.

23. A semiconductor device according to claim 22, wherein the second breakdown voltage results in a maximum current of about 10 mA/μm.

24. An electronic circuit for electrostatic discharge protection, comprising an array of semiconductor devices wherein each semiconductor device is in accordance with claim 1.

25. An electronic circuit according to claim 24, wherein the width of the circuit is about 320 μm.

26. A method of manufacturing a semiconductor device according to claim 1, wherein the device is manufactured using CMOS processing steps.

27. A semiconductor device according to claim 1, wherein a doping concentration of the diffusion region is more than a doping concentration of the well region.

28. A semiconductor device according to claim 1, further comprising a source region associated with the source, wherein the well region excludes the source region.

29. A semiconductor device according to claim 28, wherein the source region has an opposing doping type relative to the well region.

* * * * *